(12) United States Patent
Degner et al.

(10) Patent No.: US 8,573,911 B2
(45) Date of Patent: Nov. 5, 2013

(54) FLOATING FASTENERS

(75) Inventors: Brett W. Degner, Menlo Park, CA (US); Houtan R. Farahani, San Ramon, CA (US); Ron A. Hopkinson, Campbell, CA (US); William F. Leggett, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/610,822

(22) Filed: Sep. 11, 2012

(65) Prior Publication Data
US 2013/0078052 A1   Mar. 28, 2013

Related U.S. Application Data

(60) Provisional application No. 61/540,395, filed on Sep. 28, 2011, provisional application No. 61/545,088, filed on Oct. 7, 2011.

(51) Int. Cl.
*F16B 39/22* (2006.01)

(52) U.S. Cl.
USPC .................................. 411/106; 312/223.2

(58) Field of Classification Search
USPC ........ 411/106, 308, 411, 414, 103; 312/223.2
See application file for complete search history.

(56) References Cited

U.S. PATENT DOCUMENTS

| | | | | | |
|---|---|---|---|---|---|
| 2,770,997 | A | * | 11/1956 | Hansen | 411/411 |
| 3,041,913 | A | * | 7/1962 | Liska | 411/87 |
| 4,907,926 | A | * | 3/1990 | Wing | 411/366.3 |
| 5,304,024 | A | * | 4/1994 | Schuster | 411/418 |
| 5,460,441 | A | * | 10/1995 | Hastings et al. | 312/298 |
| 5,738,472 | A | * | 4/1998 | Roopnarine et al. | 411/309 |
| 6,705,648 | B1 | * | 3/2004 | Maruyama et al. | 285/334 |
| 6,726,420 | B2 | * | 4/2004 | Ward et al. | 411/436 |
| 7,018,154 | B2 | * | 3/2006 | Schmon | 411/414 |
| 7,694,926 | B2 | * | 4/2010 | Allen et al. | 248/244 |
| 8,092,115 | B1 | * | 1/2012 | McLeod et al. | 403/408.1 |
| 2005/0244249 | A1 | | 11/2005 | Sussenbach | |
| 2007/0183863 | A1 | | 8/2007 | Blackaby | |
| 2009/0103996 | A1 | | 4/2009 | Menon | |
| 2009/0261695 | A1 | | 10/2009 | Yeh et al. | |
| 2011/0031985 | A1 | | 2/2011 | Johnson | |

OTHER PUBLICATIONS

PCT Search Report, Application No. PCT/US2012/055932 dated Feb. 28, 2013.
PCT Written Opinion, Application No. PCT/US2012/055932 dated Feb. 28, 2013.

* cited by examiner

*Primary Examiner* — Gary Estremsky
(74) *Attorney, Agent, or Firm* — Womble Carlyle Sandridge & Rice LLP

(57) ABSTRACT

One or more fastenings can be used to fasten components together, such as housing components on a computing device. Each fastening can include a first opening associated with a first component, a second opening associated with a second component, a floating fastener, and a screw. The floating fastener is inserted into the first opening and/or second opening, and includes a threaded opening therein having a primary axis therethrough. The screw is inserted through first and/or second openings and into the threaded opening in the floating fastener. The screw and threaded opening combination is defined by contact between the screw and threaded opening about a thread surface that is substantially perpendicular to the primary axis, a screw thread return angle of 45 degrees or less, and a thread depth that is less than about triple the float between the major diameters of the screw and the threaded opening.

6 Claims, 12 Drawing Sheets

FLOATING FASTENERS

CROSS REFERENCE TO RELATED APPLICATIONS

This U.S. Patent Application claims priority under 35 U.S.C. 119(e) to U.S. Provisional Patent Application No. 61/540,395, filed Sep. 28, 2011 entitled "FLOATING FASTENERS" by Degner et al, and U.S. Provisional Patent Application No. 61/545,088, filed Oct. 7, 2011 entitled "FLOATING FASTENERS" by Degner et al, each of which are incorporated by reference in its entirety for all purposes.

TECHNICAL FIELD

The present invention relates generally to fastening components, and more particularly to fastening components that allow for looser tolerances in the mass production of consumer products.

BACKGROUND

There are a wide variety of ways to fasten device components together. One common component fastening approach is to use screws, particularly where the ability to disassemble the device components is desirable. This can often mean that the components to be fastened together need to have holes or other features in order to accommodate the screws, and the use of threaded holes is typical. In many cases, each of the components or items to be fastened together can have holes that are sized and threaded for a particular screw, with that screw then being inserted into aligned corresponding holes on each component.

Where the components to be fastened together are part of an overall mass produced device, such threaded holes are often built into an integrated portion of the component material itself. Multiple holes designed and aligned for each other can accommodate multiple screws for a secure fastening of components. For example, where outer housing components of a portable electronic device or other consumer product are to be fastened together in a secure fashion that permits disassembly, a plurality of strategically spaced apart screws installed into aligned screw holes on the outer housing and mating component can be a common technique.

Unfortunately, screw holes that are not adequately sized or aligned tend to be useless. As such, the use of multiple screws and screw holes spaced apart on mating components often results in the need for relatively tight tolerances with respect to the size and location of the screw holes, and of the threads therein. Of course, any introduction of relatively tight part tolerances in the context of mass production tends to increase costs, rejection rate and production times. In addition, the use of threaded holes in a device component itself can result in the need to replace the entire device component where such threads become stripped, damaged or otherwise unusable in conjunction with a suitable fastening screw.

While many designs and techniques used to fasten components together on electronic devices and other consumer products have generally worked well in the past, there is always a desire to provide further devices and techniques to allow for looser part tolerances that still result in the functional and reliable fastening of components in computing devices and other consumer products.

SUMMARY

It is an advantage of the present invention to provide parts and components that have looser tolerances with respect to their fastening aspects, and that still result in the functional and reliable fastening of those parts and components. This can be accomplished at least in part through the use of specialized oversized threads, floating fasteners as part of an overall threaded assembly, or both.

In various embodiments of the present invention, a computing device can include an outer housing including a base and a cover, the outer housing being adapted to contain a number of internal device components therein, a processor located within the outer housing, and a fastening system including a number of fastenings that are collectively adapted to removably fasten the outer housing cover to the outer housing base. In various alternative embodiments, other consumer products can include a similar fastening system used to fasten various components together. Such components can be outer housing components or other items on the overall product.

Each of the plurality of fastenings can be similarly characterized by including at least a first opening associated with a first component, a threaded second opening associated with a second component to be fastened to the first component, and a specialized oversized screw. The screw can be inserted through at least one of the first and second openings, and also into the threaded opening in the floating fastener. The screw and threaded opening combination can be defined by contact between the screw and threaded opening about a thread surface that is substantially perpendicular to the primary axis, a screw thread return angle of 45 degrees or less, and a thread depth that is less than about triple the float between the major diameters of the screw and the threaded opening. In some embodiments, the screw thread return angle can be about 30 degrees.

In one particular embodiment an outer housing for a computing device is disclosed. The outer housing includes at least: (1) a base adapted to contain a plurality of internal device components therein; (2) a cover adapted to seal the plurality of internal device components within the outer housing; and (3) a number of fastenings that are collectively adapted to removably fasten the cover to the base. Each of the fastenings includes at least: (1) a first opening associated with the cover; (2) a second opening associated with the base, the second opening having a first diameter; and (3) a floating fastener inserted into the second opening, the floating fastener having a threaded opening therein. The floating fastener has an outer diameter less than the first diameter of the second opening allowing it to shift laterally within the second opening. The fastenings also include: (1) a restraining attachment configured to attach to an end of the floating fastener, thereby securing the floating fastener within the second opening; and (2) a screw inserted through the first opening, and into the threaded opening in the floating fastener. When the first and second opening are not properly aligned the disclosed floating fastener laterally shifts within the second opening to allow the screw to be properly seated within the threaded opening in the floating fastener.

In another disclosed embodiment a fastening system including a number of fastenings that are collectively adapted to removably fasten a first component to a second component is disclosed. Each of the fastenings includes at least the following: (1) a first opening associated with the first component having a first axis therethrough; (2) a second opening associated with the second component having a second axis therethrough; (3) a floating fastener inserted into the second opening, having a threaded opening therein with a third axis therethrough; and (4) a screw inserted through the first opening and into the threaded opening in the floating fastener. This configuration allows a third axis of the floating fastener to be displaced from the second axis of the second opening and to align with the first axis of the first opening, thereby allowing the screw to be properly seated within the threaded opening of the floating fastener when the first and second axes are offset from one another.

Other apparatuses, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The embodiments will be readily understood by the following detailed description in conjunction with the accompanying drawings, wherein like reference numerals designate like structural elements, and in which.

DETAILED DESCRIPTION

Exemplary applications of apparatuses and methods according to the present invention are described in this section. These examples are being provided solely to add context and aid in the understanding of the invention. It will thus be apparent to one skilled in the art that the present invention may be practiced without some or all of these specific details. In other instances, well known process steps have not been described in detail in order to avoid unnecessarily obscuring the present invention. Other applications are possible, such that the following examples should not be taken as limiting.

In the following detailed description, references are made to the accompanying drawings, which form a part of the description and in which are shown, by way of illustration, specific embodiments of the present invention. Although these embodiments are described in sufficient detail to enable one skilled in the art to practice the invention, it is understood that these examples are not limiting; such that other embodiments may be used, and changes may be made without departing from the spirit and scope of the invention.

The invention relates in various embodiments to fasteners for the outer housing components of a computing device, such as any of the iMac® personal computer, MacBook® laptop computer or iPad® tablet computer manufactured by Apple Inc. of Cupertino, Calif. Although the subject computing device can be a portable computing device, including even portable media players and cellular telephones, it will be readily appreciated that the various embodiments of the present invention disclosed herein can also be used with larger personal computing devices, servers and the like. Furthermore, it will be readily understood that the fasteners of the present invention can also be used in many other embodiments with other consumer products that are not computing devices. As such, the various inventive fastening screws, bolts, nuts and systems provided herein can be extended to a wide variety of other devices and applications, as will be readily appreciated in view of the entire disclosure herein.

Figure 1A:
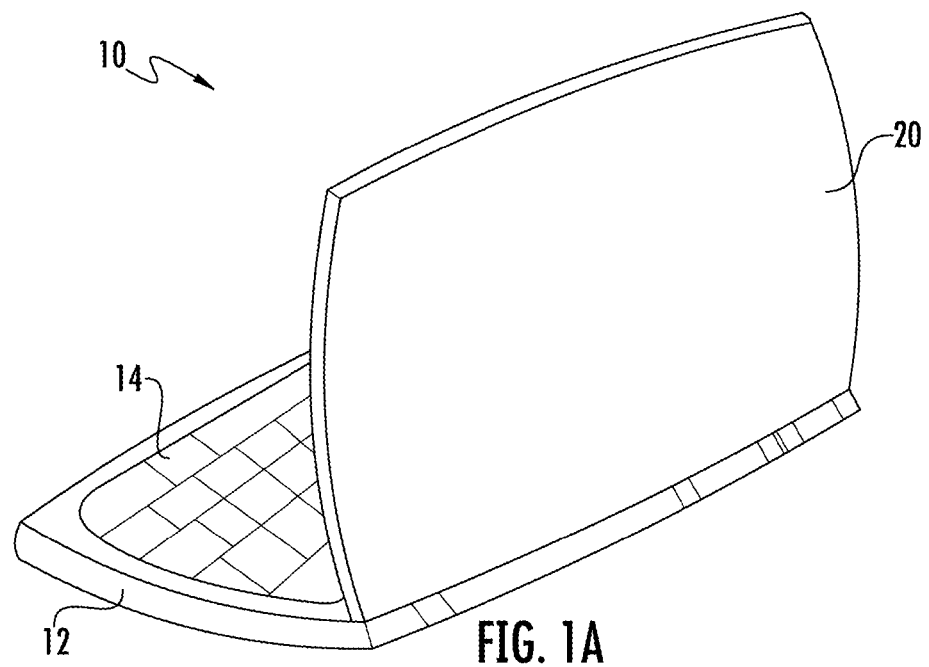
FIG. 1A illustrates in front perspective view an exemplary personal computing device.

Referring first to FIG. 1A, one example of a personal computing device in the form of a laptop computer is shown in front perspective view. Laptop computer 10 can be, for example, a MacBook® laptop computer, although other brands and models of laptop computers are contemplated for use with the present invention. Laptop computer 10 can have an upper or top case portion 20, as well as a lower or bottom case portion 12 that may include a keyboard 14, touchpad and other various components. Both upper portion 20 and lower portion 12 may include various internal components therein, such as, for example, processors, storage, busses, cards, power supplies, disk drives, displays, I/O interfaces, modems, and the like.

Figure 1B:
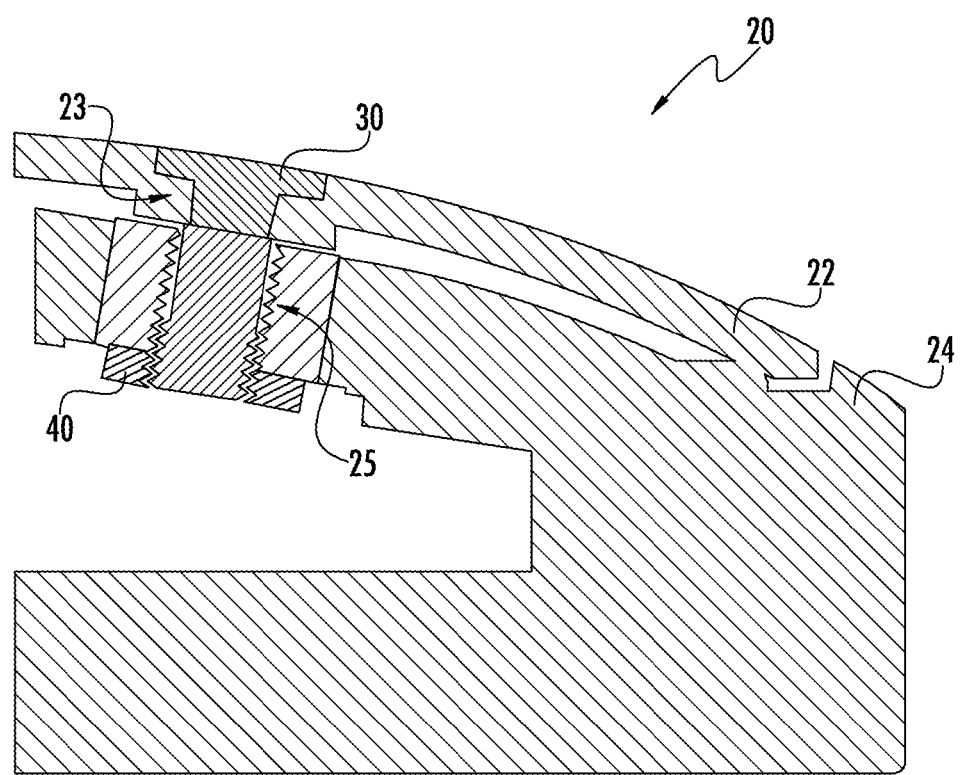
FIG. 1B illustrates in cut away side cross-sectional view an exemplary top case portion of the personal computing device of FIG. 1A.

Continuing with FIG. 1B, an exemplary top case portion of the personal computing device of FIG. 1A is shown in cut away side cross-sectional view. Top case portion 20 can include an outer housing base 24 and outer housing cover 22 that is fastened to the base by a plurality of bolts or screws 30. Such screws 30 can pass through respective openings 23 in outer housing cover 22 and threaded openings 25 in housing base 24. A threaded nut 40 or other component can be fastened onto the far threaded end of bolt or screw 30 after it is inserted, so as to hold screw 30 in place.

This arrangement shown in FIG. 1B can be repeated numerous times for a plurality of screws 30 and aligned openings 23, 25, such that the housing cover 22 is then firmly attached to the housing base 24 in a removable manner. As noted above, the use of numerous screws and aligned openings can result in the need for tight tolerances with respect to the size and location of such items. For example, the location of opening 23 should typically be well aligned with respect to threaded opening 25, such that the screw 30 can be properly inserted into both. While only one instance is shown for purposes of illustration, it will be readily appreciated that such openings need to be well aligned for each instance of multiple screws 30 and openings 23, 25 across top case portion 20.

While the issue of tighter part tolerances may not be much of a problem for relatively inexpensive and commercially available screws, such tight tolerances can raise costs with respect to the mass production of the housing cover 22 and housing base 24, with their respective sets of openings 23, 25. Because threaded screws and threaded nuts or openings tend to result in tight fits in many standard and commercially available variations, it can become difficult to alleviate the tolerance constraints that typically arise when such screws and threaded openings are used to fasten components together. As such, alternative forms of screws and fastening arrangements that allow for looser part tolerances would be helpful. Such alternative fastening arrangements can include the use of specialized oversized threads, the use of floating fasteners as part of an overall threaded assembly, or both of these features in combination with each other.

Figure 2A:
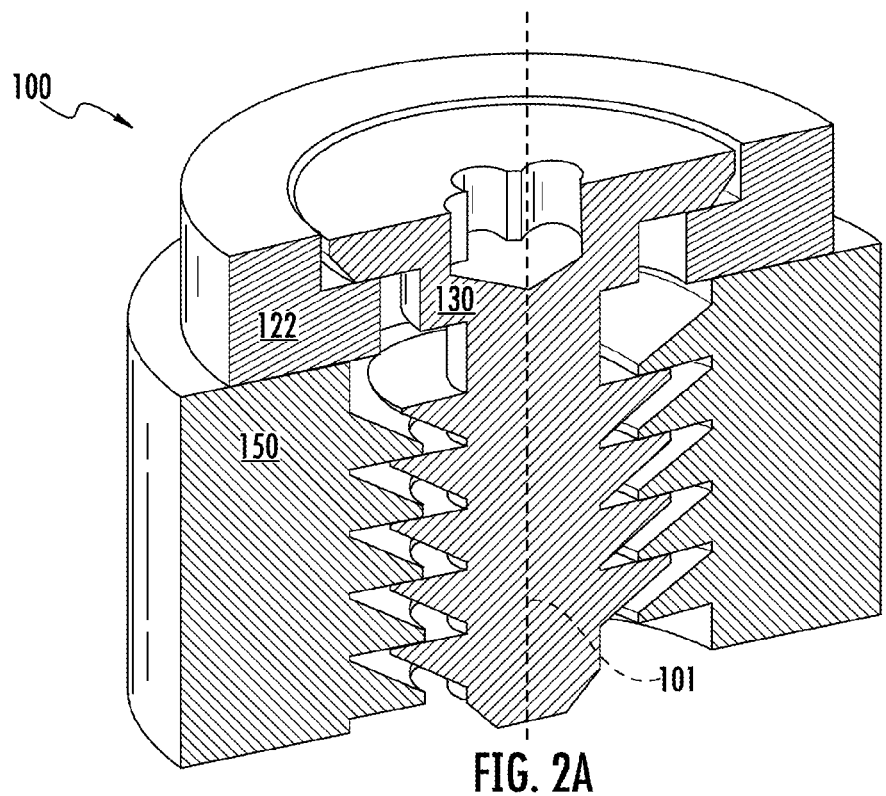
FIG. 2A illustrates in side cross-sectional view an exemplary fastening arrangement according to one embodiment of the present invention.

Turning next to FIG. 2A, an exemplary fastening arrangement according to one embodiment of the present invention is shown in side cross-sectional view. Fastening arrangement 100 is adapted to fasten a first component to a second component, such as two outer housing components for a consumer device. Fastening arrangement 100 can represent a single fastening from a plurality of fastenings, with each such fastening including a screw 130 that is inserted through an opening in a first component 122 to be fastened and screwed into nut threads on a corresponding mating component 150. The opening in first component 122 can be countersunk, as shown, or can be any of a variety of other types of openings that accommodate a corresponding screw head, as will be readily appreciated. Mating component 150 can be the second component itself that is to be fastened to the first component 122, or this mating component can be a floating fastener that engages with a second component, various examples of which are set forth in greater detail below.

Each of screw 130, its corresponding opening in first component 122 and the threaded opening in mating component 150 can be centered about a primary axis, such as axis 101. While the center axis for each of these items will ideally overlap, the present invention specifically contemplates for arrangements where the center axis for the opening in first component 122 is offset from the center axis for the threaded opening in mating component 150. Such offset can be the result of differing part dimensions that are still within looser tolerances than what is standard for such arrangements. Again, it will be readily appreciated that the specialized oversized screw and nut threads set forth in FIGS. 2A and 2B can be used separate from or in conjunction with the various floating fasteners set forth herein.

Figure 2B:
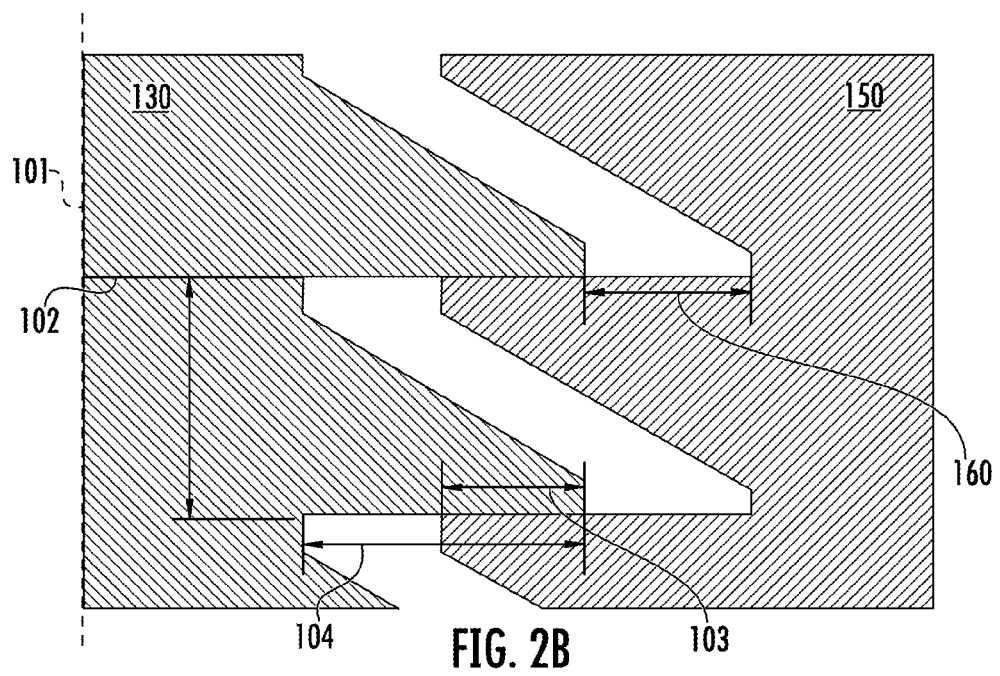
FIG. 2B illustrates in close up side cross-sectional view the engaged screw and nut threads of the fastening arrangement of FIG. 2A according to one embodiment of the present invention.

FIG. 2B illustrates in close up side cross-sectional view the engaged screw and nut threads of the fastening arrangement of FIG. 2A according to one embodiment of the present invention. Again, screw 130 and the threaded opening of mating component 150 can both be generally centered about a primary axis, such as axis 101. While many standard screws tend to require or be self centering within a corresponding nut or threaded opening, the specialized design of screw 130 and the threaded opening of mating component 150 specifically contemplates for the center axes of this screw and opening to be offset from each other such that the mating arrangement of the screw and opening still works adequately.

As shown, a significant amount of float 160 exists between the threads of screw 130 and the corresponding threads of mating component 150 when the screw is inserted and fully engaged into the threaded opening. Such a float 160 generally represents the difference between the major diameters of the screw 130 and the threaded opening in mating component 150. Although only one half of the screw and opening arrangement is shown in FIG. 2B, it will be readily appreciated that the screw and hole arrangement is centered and symmetrical for purposes of illustration and discussion. As such, the same amount of float 160 exists on the opposite side of the screw (not shown). This float 160 on both sides of the screw essentially provides a considerable amount of "play" or "slop" in the engagement of the screw and opening, while still resulting in a fully functional screw engagement even where the screw and opening axes are significantly offset. Such a significant amount of float 160 then results in an increase in the location tolerances for the opening in first component 122 and the threaded opening in mating component 150.

As will be readily appreciated, the threaded arrangements for screw 130 and the corresponding nut or threaded opening in mating part 150 are non-standard threads. As shown in FIG. 2B, the threads of the screw 130 and the threaded opening in part 150 engage each other at a contact surface 102 that can be at or about a tangent that is substantially perpendicular to primary axis 101. This is substantially different that a typical V-thread formed by rolling techniques. The subject customized thread can also have a non-contacting portion that recedes at a particular return angle. As shown in FIGS. 2A and 2B, this screw thread return angle can be about 30 degrees, although this angle could be larger or smaller, as may be desired. In various embodiments, this screw thread return angle can be about 45 degrees, and in some embodiments this angle can be smaller.

As shown, the overall thread arrangement can resemble a buttress type thread, which is suitable for accepting increased loads in a single axial direction with respect to the screw and threaded opening arrangement. Unlike a typical 45/7 buttress type thread, however, the particular thread arrangement here follows a 30/0 pattern where the contact surface is at about a 0 degree angle with respect to the normal to the screw axis and the return angle is about 30 degrees with respect to the normal. In addition, the substantial amount of float 160 between the screw and threaded opening is not a feature of a buttress type thread. As will be readily appreciated by those skilled in the art, the specialized threads set forth herein is not readily formed by standard thread rolling formation techniques. As such, these threads can be cut by customized thread cutting tools set for the particular dimensions and angles disclosed.

As noted above, the amount of float 160 can be sufficiently large, so as to allow for greater tolerances in the locations of the respective openings in first component 122 and second or mating component 150. Of course, a greater float 160 then results in a correspondingly decreased overlap 103 between the contacting portion of the screw thread and nut thread. In various embodiments, the float 160 can be greater than one third of the thread depth 104, which is generally the major diameter minus the minor diameter of the thread. In other words, the thread depth 104 can be less than about triple the float 160 between the major diameters of the screw and the threaded opening. In some embodiments, the float can be up to about 40% of the thread depth. While further increases in the float can allow for greater tolerances in screw hole locations, such further increases then result in less overlap and ultimately thread failures or the inability to engage threads adequately. A thread truncation of about ⅛ the thread pitch can be used as shown, or larger or smaller truncations may alternatively be used as may be desired.

In a particular embodiment, which is provided for purposes of illustration only, the threaded arrangement can include a screw having a major diameter of about 1.85 mm, a minor diameter of about 1.20 mm, a pitch of about 0.50 mm, a contact angle of about 0 degrees, and a return angle of about 30 degrees. The corresponding float can then be about 0.25 mm, resulting in a major diameter for the threaded opening of about 2.10 mm Of course, a wide variety of other dimensions may also be used, as may be appropriate for a given application.

In addition to the relatively oversized threads having a substantial amount of float, another feature that can aid in permitting relatively looser tolerances in components to be screwed together can involve a floating fastener. In general, such a floating fastener can be inserted into one or both openings of the components that are being screwed together, and can effectively serve as the mating component 150 in the foregoing example. In addition to being fitted within one or both openings of components to be fastened, such a floating fastener can also have a threaded internal opening that is adapted to receive a corresponding screw. In this manner, any damage to the floating fastener threads can result in the relatively cheaper and easier replacement of the floating fastener rather than an entire component that has the threads integrated therein.

Figure 3A:
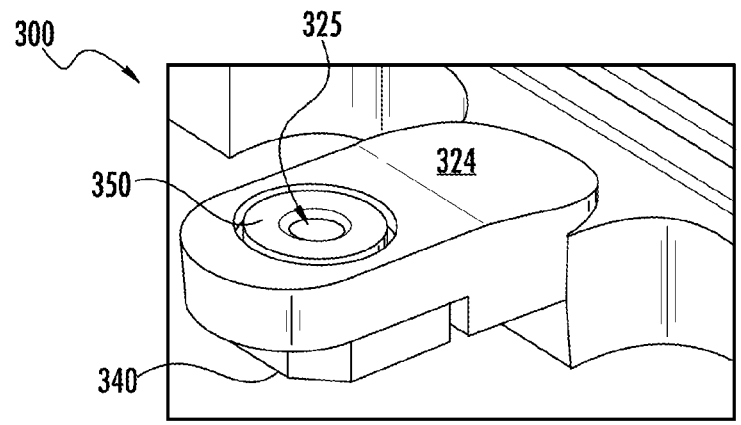
FIG. 3A illustrates in top perspective view an exemplary floating fastener arrangement using a press-fit base nut according to one embodiment of the present invention.

Turning now to FIG. 3A an exemplary floating fastener arrangement using a press-fit base nut according to one embodiment of the present invention is shown in top perspective view. Arrangement 300 can include a housing base 324 having an opening 325 therethrough that is used for purposes of screw fastening. A particular floating fastener 350 having a threaded internal opening can be fitted through the opening 325 in the housing base 324 and secured in place by way of a base nut 340 or other suitable restraining attachment.

Figure 3B:
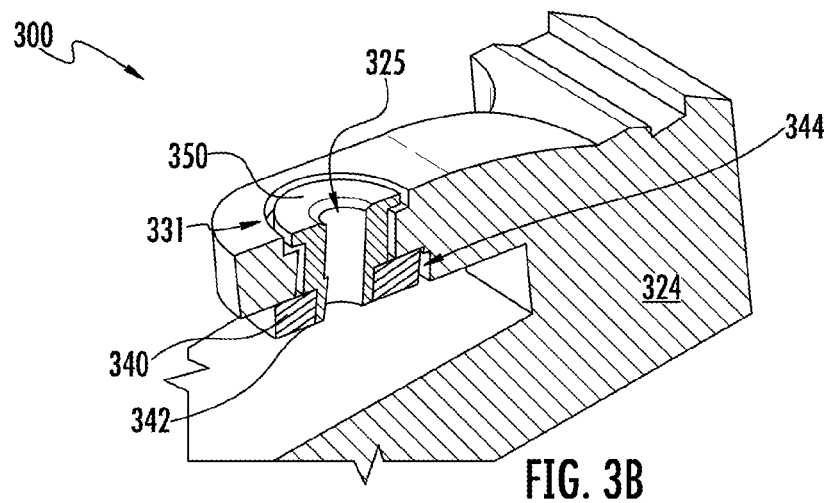
FIG. 3B illustrates in top perspective cross-sectional view the press-fit base nut floating fastener arrangement of FIG. 3A according to one embodiment of the present invention.

FIG. 3B illustrates in top perspective cross-sectional view the press-fit base nut floating fastener arrangement of FIG. 3A. Again, arrangement 300 depicts a floating fastener 350 that is inset within an opening 325 in a housing base 324. Once the floating fastener 350 is inserted into the opening 325, a base nut 340 can be press fit about the bottom end of the floating fastener. To aid in creating a firm press fit between fastener 350 and nut 340, a gasket 342 and/or adhesive can be used. In addition, the base nut 340 can include at least one flat or otherwise engaging edge that abuts a flat or engaging edge at location 344, such that rotation of the base nut is restricted. Such an opposing engaging edge can be part of the housing base 324.

Figure 3C:
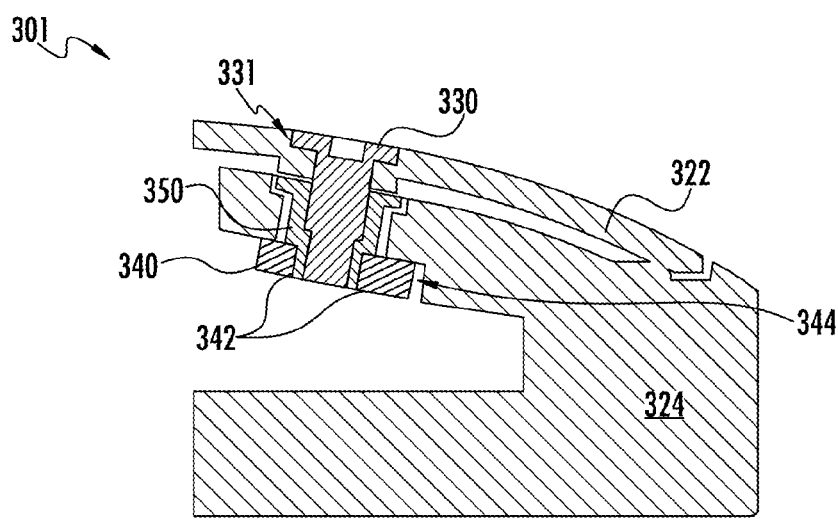
FIG. 3C illustrates in side cross-sectional view the press-fit base nut floating fastener arrangement of FIGS. 3A and 3B according to one embodiment of the present invention.

Next, FIG. 3C illustrates in side cross-sectional view the press-fit base nut floating fastener arrangement of FIGS. 3A and 3B according to one embodiment of the present invention. As shown, arrangement 301 includes all of the items depicted in FIGS. 3A and 3B, as well as an outer housing cover 322 that is fastened to the housing base 324 by way of a screw 330 that is inserted through an aligned opening in the housing cover 322 and into the threaded opening of floating fastener 350. It is worth noting that the head and neck of screw 350 can be sufficiently thin or narrowed, such that a considerable amount of float or "play" can exist between the screw head and the opening in housing cover 322, such as at location 331. Again, this permits greater location tolerances for the openings in housing base 324 and cover 322.

Figure 3D:
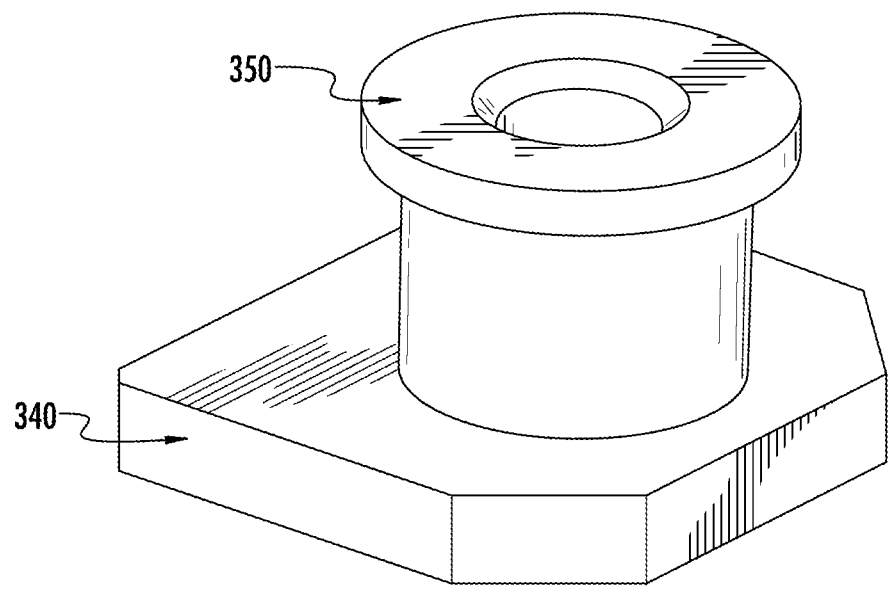
FIG. 3D illustrates in side perspective view the press-fit base nut floating fastener for the arrangement of FIGS. 3A-3C according to one embodiment of the present invention.
Figure 3E:
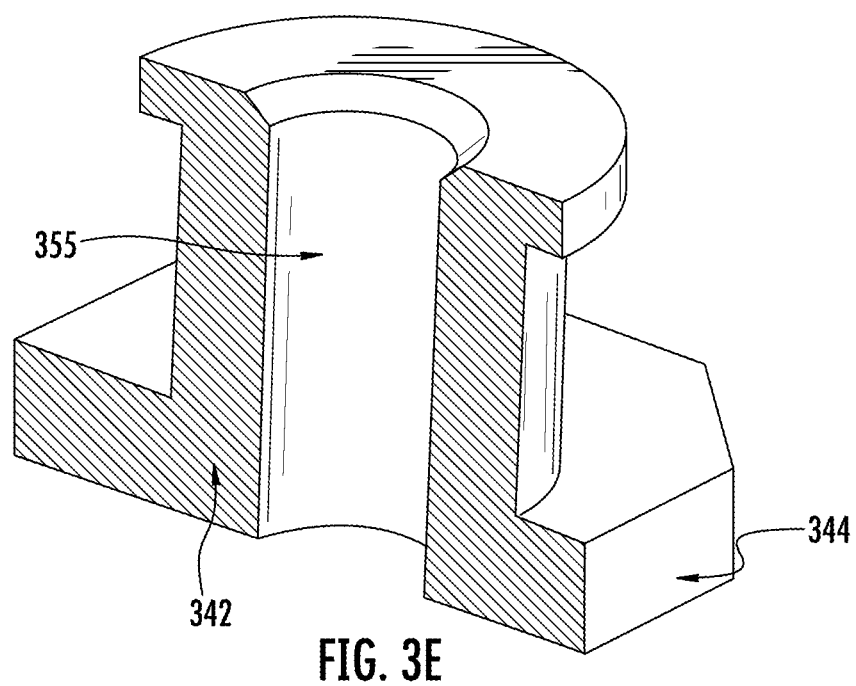
FIG. 3E illustrates in side perspective cross-sectional view the press-fit base nut floating fastener of FIG. 3D according to one embodiment of the present invention.

Continuing on, FIG. 3D illustrates in side perspective view while FIG. 3E illustrates in side perspective cross-sectional view the press-fit base nut floating fastener for the arrangement of FIGS. 3A-3C. As noted above, the depicted floating fastener 350 and base nut 340 combination can be sized to effectively allow an increased amount of float in the various measurements with respect to the aligned openings in the housing base and cover. In order to be secured within at least one of the openings (in this case the opening in the housing base), floating fastener 350 can have an upper flange while the base nut 340 is press fit to the lower end to effectively form a lower flange. Again, a suitable gasket 342 and/or adhesive can be used to effect a proper press fit between floating fastener 350 and base nut 340. As noted above, floating fastener 350 includes an internal thread 355 that is adapted to accept and mate with a fastening screw. A flat or otherwise engaging edge 344 can be adapted to contact a suitable component to prevent rotation of the fastener 350 and nut 340 combination once it is installed.

Figure 4A:
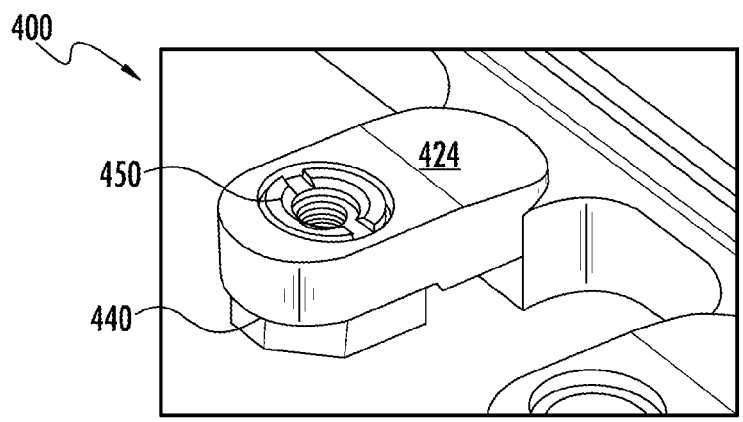
FIGS. 4A through 4C illustrate in top perspective, top perspective cross sectional and side cross-sectional views an exemplary floating fastener arrangement using a threaded base nut according to one embodiment of the present invention.
Figure 4B:
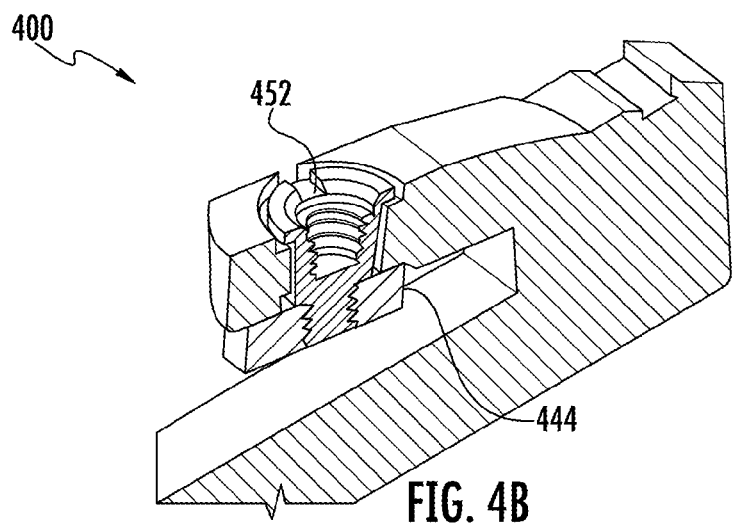
Figure 4C:
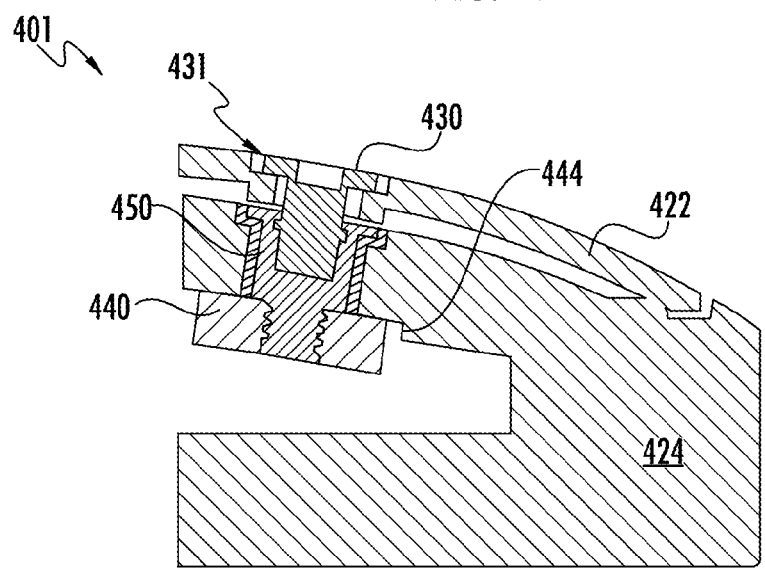

FIGS. 4A through 4C illustrate in top perspective, top perspective cross sectional and side cross-sectional views an exemplary floating fastener arrangement using a threaded base nut according to one embodiment of the present invention. As shown, arrangements 400 and 401 can be substantially similar to arrangements 300 and 301 respectively, with one notable exception. As such, a housing base 424 can have an opening therethrough that is used for purposes of screw fastening, and a floating fastener 450 having a threaded internal opening can be fitted through the opening and secured in place by way of a base nut 440 or other suitable component. Similar to the foregoing embodiment, such a base nut 440 can have a flat or otherwise engaging edge 444 that contacts a suitable component to prevent rotation of the fastener 450 and nut 440 combination.

Unlike the foregoing embodiment, however, base nut 440 is threaded onto the bottom portion of floating fastener 450. Such a threaded engagement is different that a press-fit engagement, as will be readily appreciated. As shown in the full arrangement 401 in FIG. 4C, the screw 430—floating fastener 450—base nut 440 combination effectively fastens housing base 424 to housing cover 422. A similar amount of float or slop between the screw head and opening in the housing cover 422 can exist at or about location 431, for example, such that looser part tolerances can be used. Also, in some embodiments the floating fastener 450 can have a split head or a slot 452 in the head, such that the floating fastener can be unscrewed and removed.

Figure 5A:
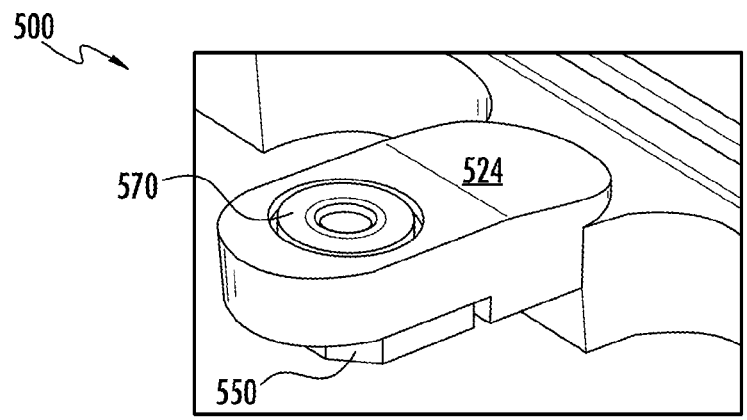
FIG. 5A illustrates in top perspective view an exemplary floating fastener arrangement using a press-fit collar nut according to one embodiment of the present invention.

Moving now to FIG. 5A an exemplary floating fastener arrangement using a press-fit collar nut according to one embodiment of the present invention is shown in top perspective view. As shown, arrangements 500 and 501 can be similar to the foregoing arrangements 300, 400 and 301, 401 respectively. Again, a housing base 524 can have an opening therethrough that is used for purposes of screw fastening, and a floating fastener 550 having a threaded internal opening can be fitted through the opening and secured in place.

Figure 5B:
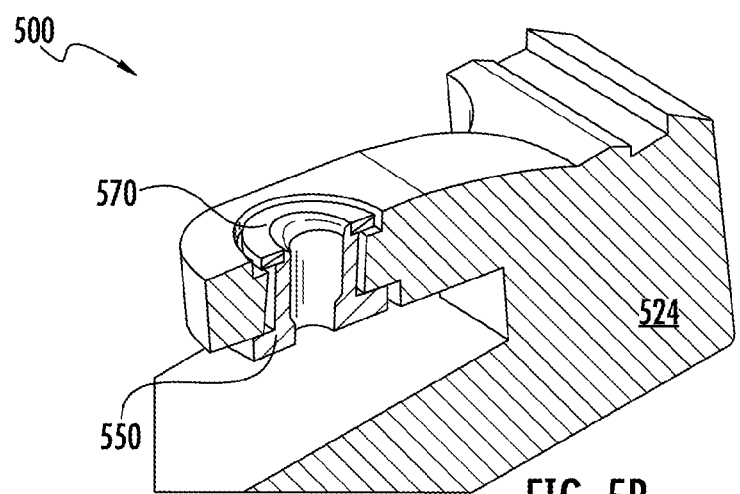
FIG. 5B illustrates in top perspective cross-sectional view the press-fit collar nut floating fastener arrangement of FIG. 5A according to one embodiment of the present invention.

Unlike the base nut of the foregoing embodiments, a press-fit collar nut 570 is used to secure the upper portion of floating fastener 550. As such, the floating fastener 550 has a bottom flange that secures the bottom of the fastener in place with respect to the opening in housing base 524. FIG. 5B illustrates this arrangement particularly well in top perspective cross-sectional view. As shown in the full arrangement 501 in FIG. 5C, the screw 530—floating fastener 550—collar nut 570 combination effectively fastens housing base 524 to housing cover 522. Again, a similar amount of float or slop between the screw head and opening in the housing cover can exist such that looser part tolerances can be used. Also, a flat or otherwise engaging edge 554 can be used to restrict rotation of installed fastener 550.

Figure 5C:
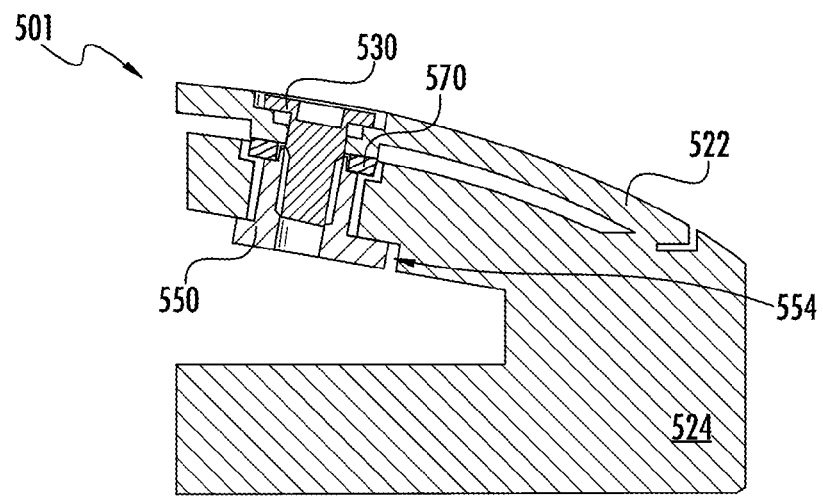
FIG. 5C illustrates in side cross-sectional view the press-fit collar nut floating fastener arrangement of FIGS. 5A and 5B according to one embodiment of the present invention.
Figure 5D:
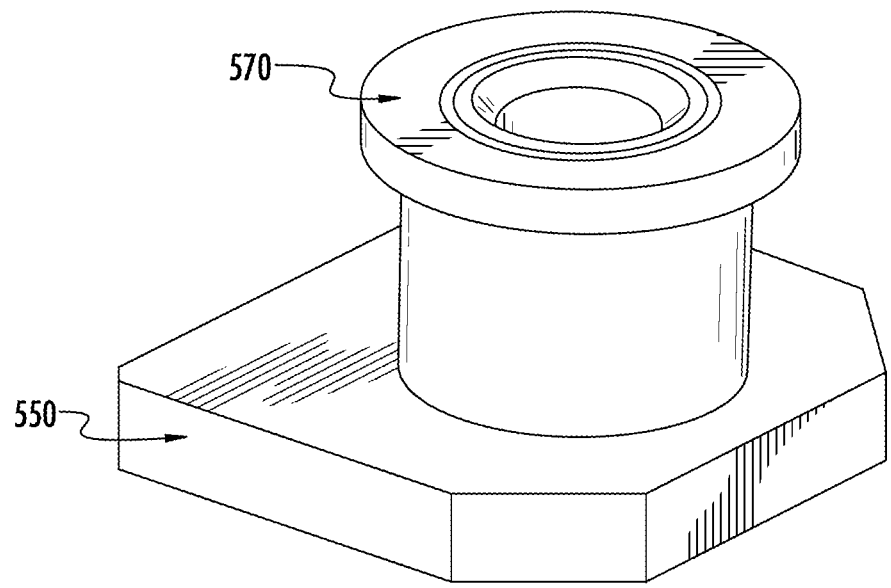
FIG. 5D illustrates in side perspective view the press-fit collar nut floating fastener for the arrangement of FIGS. 5A-5C according to one embodiment of the present invention.
Figure 5E:
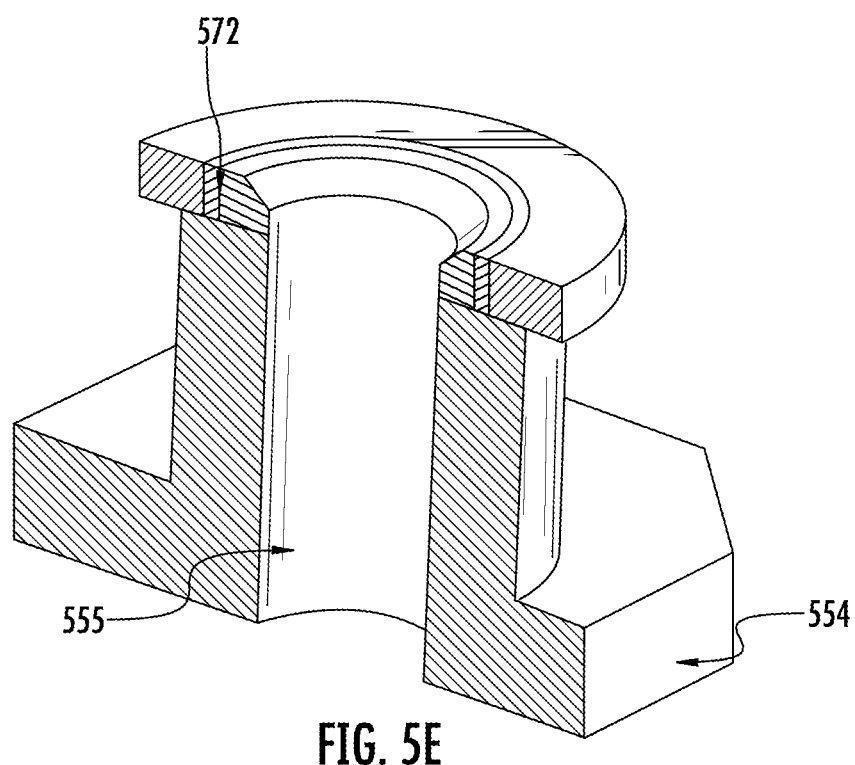
FIG. 5E illustrates in side perspective cross-sectional view the press-fit collar nut floating fastener of FIG. 5D according to one embodiment of the present invention.

Continuing on, FIG. 5D illustrates in side perspective view while FIG. 5E illustrates in side perspective cross-sectional view the press-fit collar nut floating fastener for the arrangement of FIGS. 5A-5C. Similar to the foregoing embodiments, the depicted floating fastener 550 and collar nut 570 combination can be sized to effectively allow an increased amount of float in the various measurements with respect to the aligned openings in the housing base and cover. In order to be secured within at least one of the openings (i.e., the opening in the housing base), floating fastener 550 can have an lower flange while the collar nut 570 is press fit to the upper end of the fastener to effectively form an upper flange. A suitable gasket 572 and/or adhesive can be used to affect a proper press fit between floating fastener 550 and collar nut 570. Similar to the foregoing embodiments, floating fastener 550 includes an internal thread 555 that is adapted to accept and mate with a fastening screw. In addition, a flat or otherwise engaging edge 554 can be adapted to contact a suitable component to prevent rotation of the fastener 550 once it is installed.

Figure 6A:
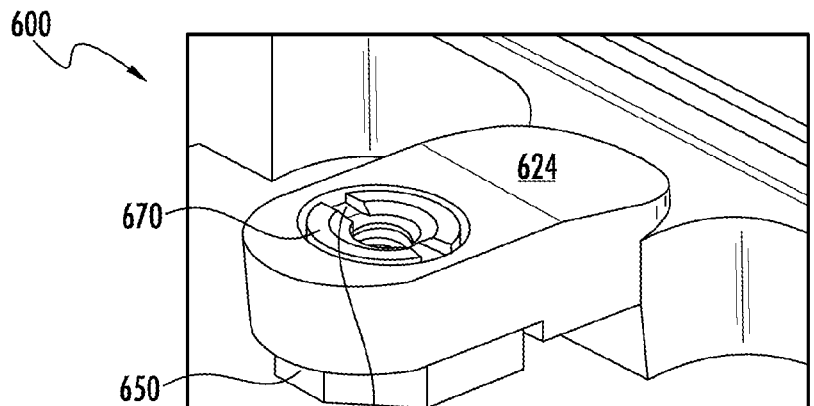
FIGS. 6A through 6C illustrate in top perspective, top perspective cross sectional and side cross-sectional views an exemplary floating fastener arrangement using a threaded collar nut according to one embodiment of the present invention.
Figure 6B:
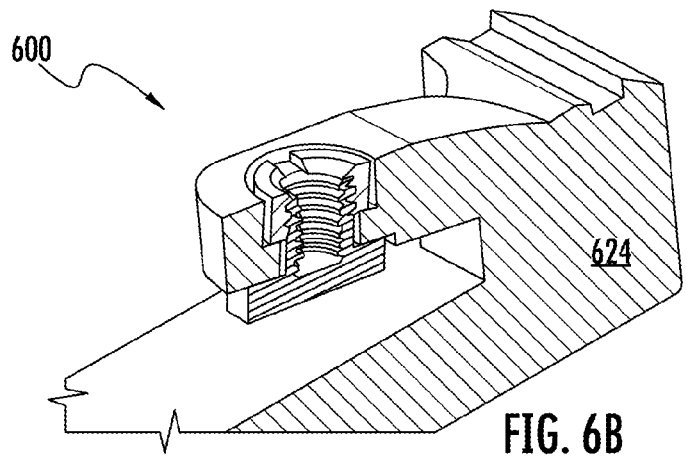
Figure 6C:
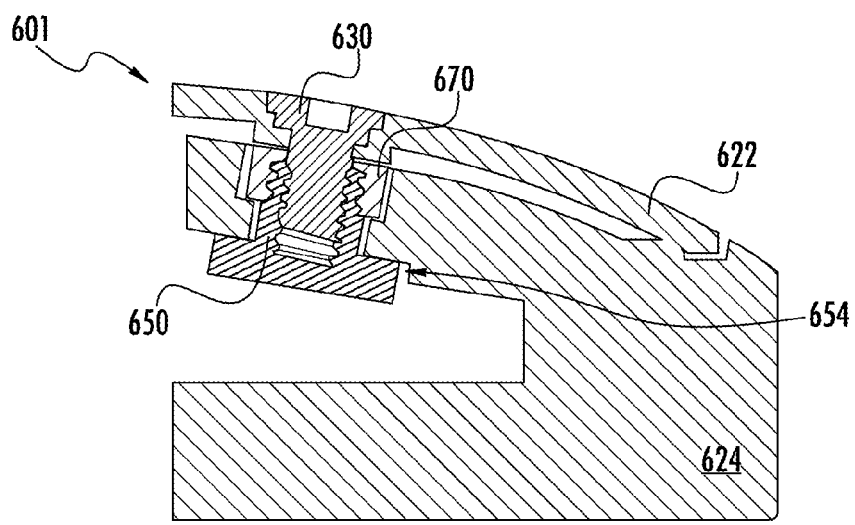

FIGS. 6A through 6C illustrate in top perspective, top perspective cross sectional and side cross-sectional views an exemplary floating fastener arrangement using a threaded collar nut according to one embodiment of the present invention. As shown, arrangements 600 and 601 can be substantially similar to arrangements 500 and 501 respectively, with the notable exception again being a threaded mating rather than a press-fit between the floating fastener 650 and collar nut 670. In all other respects, the arrangement is substantially similar. As such, the screw 630—floating fastener 650—collar nut 670 combination effectively fastens housing base 624 to housing cover 622, and a significant amount of float or slop between the screw head and opening in the housing cover can exist such that looser part tolerances can be used. Similarly, a flat or otherwise engaging edge 654 can be used to restrict rotation of the installed fastener 650.

Figure 7A:
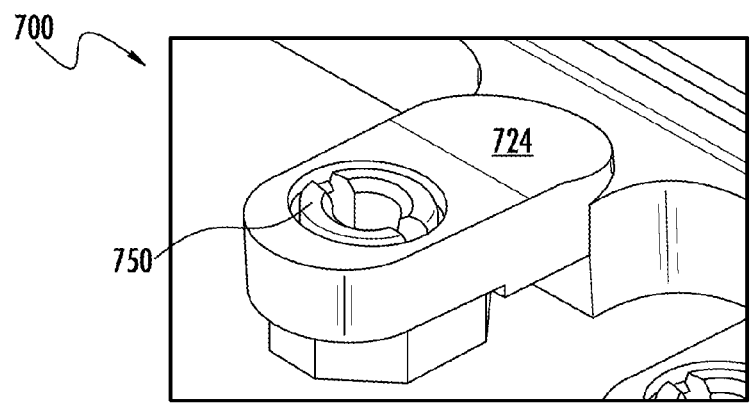
FIGS. 7A through 7C illustrate in top perspective, top perspective cross sectional and side cross-sectional views an exemplary floating fastener arrangement using a single body snap nut according to one embodiment of the present invention.
Figure 7B:
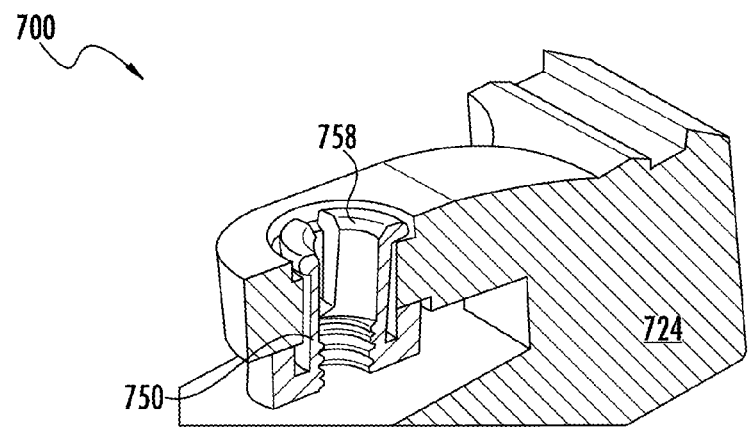
Figure 7C:
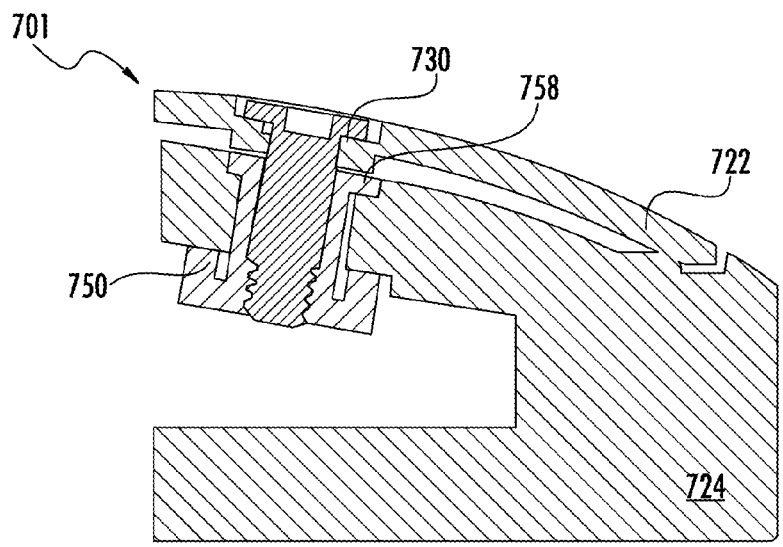

FIGS. 7A through 7C illustrate in top perspective, top perspective cross sectional and side cross-sectional views an exemplary floating fastener arrangement using a single body snap nut according to one embodiment of the present invention. Arrangements 700 and 701 are similar to the foregoing embodiments in that a screw 730 and floating fastener 750 combination is used to fasten housing cover 722 to housing base 724. Unlike the foregoing embodiments, there is no nut used with floating fastener 750. Rather, fastener 750 comprises a single integrated component having both top and bottom flanges to secure itself in place within the opening in housing base 724. This can be accomplished through the use of a snap nut 758 or flange at the top of the floating fastener 750. As shown, the snap nut portion 758 is adapted to be pinched such that it can be inserted through the opening, with the snap nut or flange then expanding and snapping into place after it passes through to the other side of the opening. An internal threaded portion is adapted to accept screw 730, as in the other embodiments.

Figure 8A:
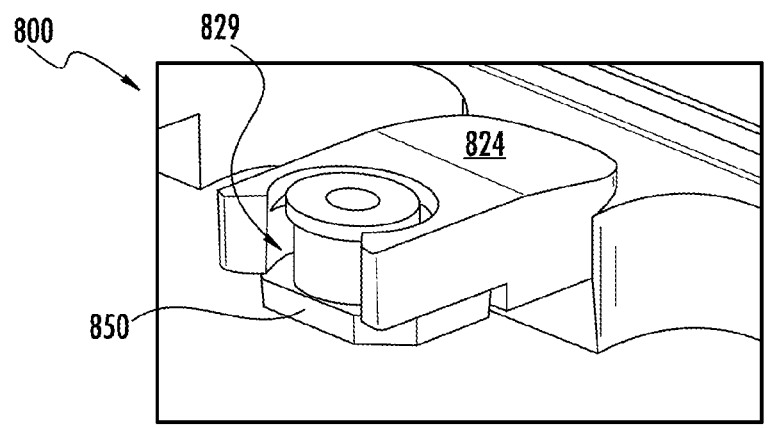
FIGS. 8A through 8C illustrate in top perspective, top perspective cross sectional and side cross-sectional views an exemplary floating fastener arrangement using an open cleat and single body nut according to one embodiment of the present invention.
Figure 8B:
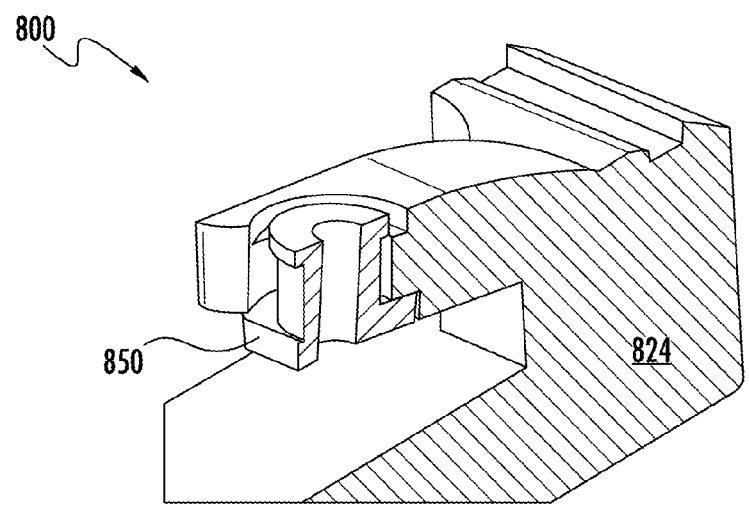
Figure 8C:
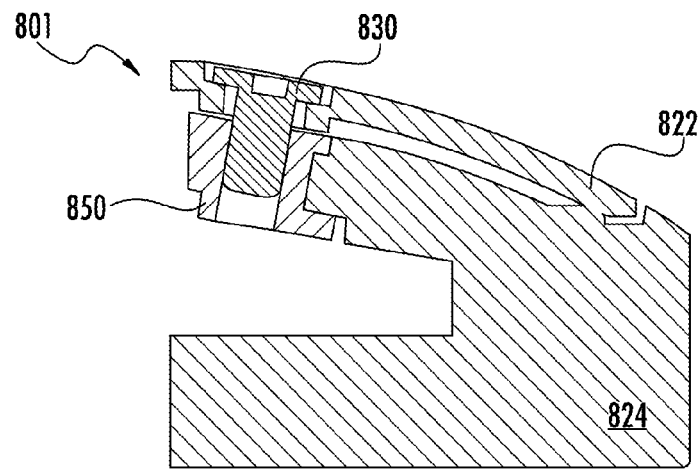

FIGS. 8A through 8C illustrate in top perspective, top perspective cross sectional and side cross-sectional views an exemplary floating fastener arrangement using an open cleat and single body nut according to one embodiment of the present invention. Arrangements 800 and 801 are similar to the foregoing embodiments in that a screw 830 and floating fastener 850 combination is used to fasten housing cover 822 to housing base 824. Similar to the previous embodiment, there is no nut used with floating fastener 850, which comprises a single integrated component having both top and bottom flanges to secure itself in place within the opening in housing base 824. Unlike the previous embodiment, however, the single body floating fastener 850 does not have a collapsing or pinchable component to allow it to pass through the opening. Rather, the respective opening in housing base 824 has a side opening 829 that allows the floating fastener to slide into position sideways through the side opening. An internal threaded portion is adapted to accept screw 830, as in the other embodiments. Also, a flat or otherwise engaging portion along one of the flanges can restrict rotation of the floating fastener 850.

Figure 9A:
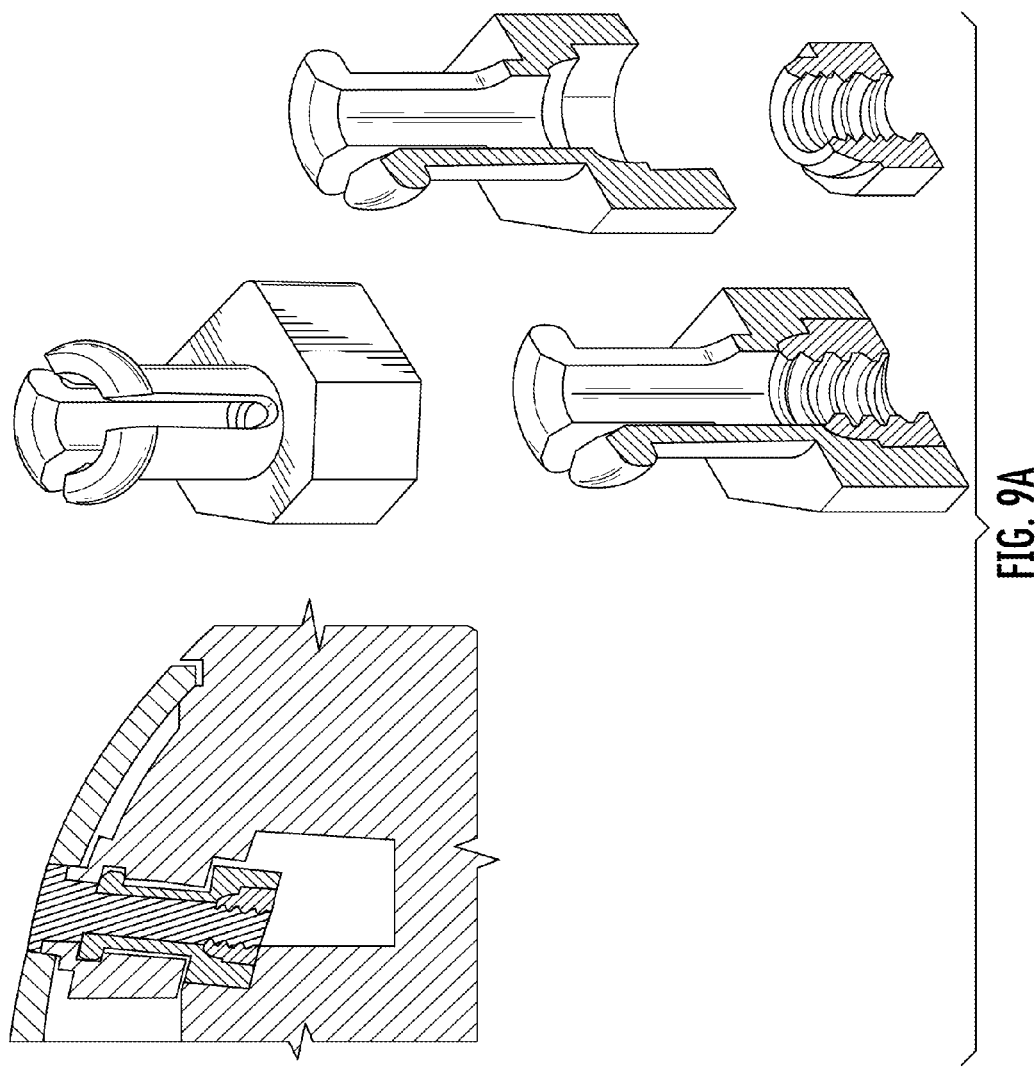
FIGS. 9A through 9B illustrate in top perspective, top perspective cross sectional and side cross-sectional views an exemplary floating fastener arrangement using an insert mold and unified snap and insert mold and separate snap, respectively, according to one embodiment of the present invention.
Figure 9B:
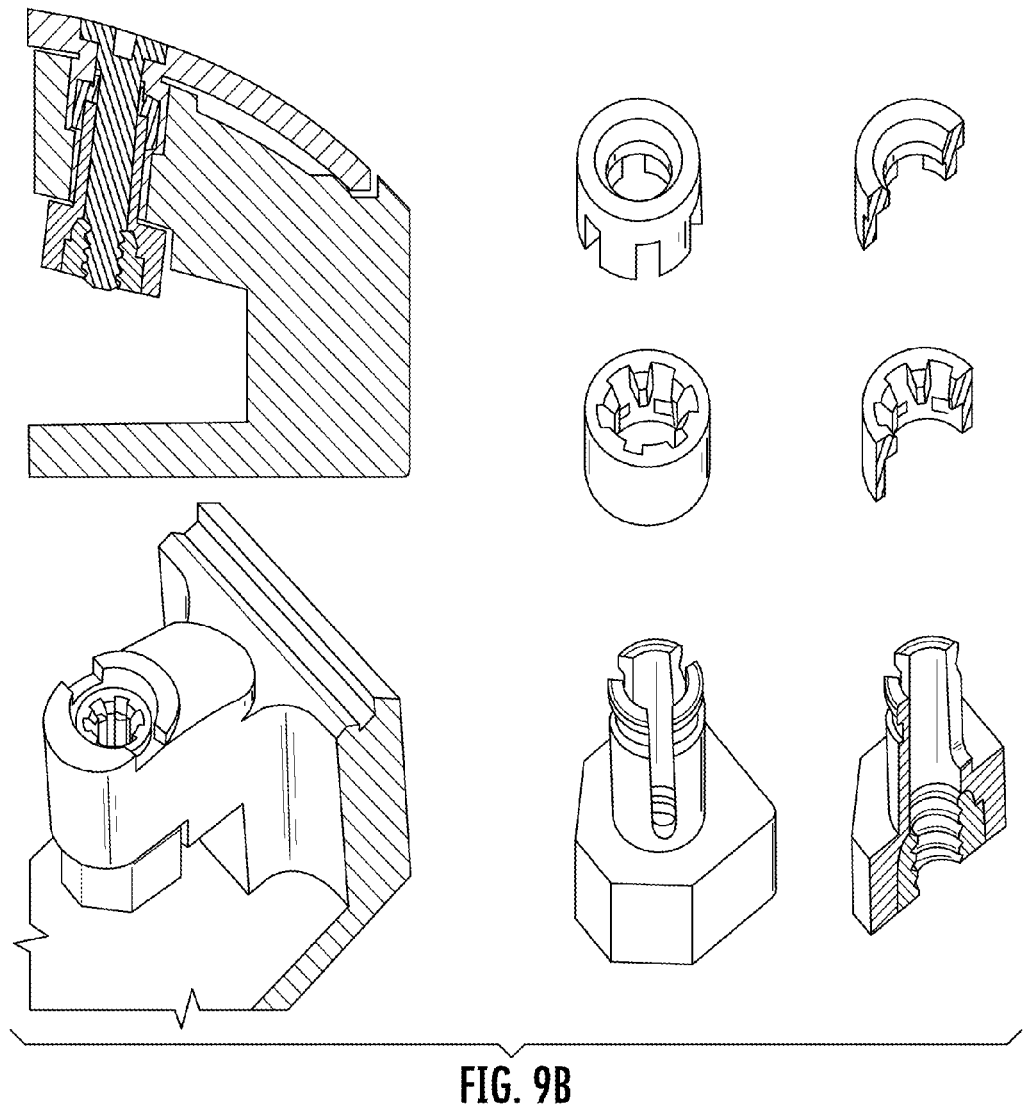

FIGS. 9A through 9B illustrate in top perspective, top perspective cross sectional and side cross-sectional views an exemplary floating fastener arrangement using an insert mold and unified snap and insert mold and separate snap, respectively, according to one embodiment of the present invention.

Although the foregoing invention has been described in detail by way of illustration and example for purposes of clarity and understanding, it will be recognized that the above described invention may be embodied in numerous other specific variations and embodiments without departing from the spirit or essential characteristics of the invention. Certain changes and modifications may be practiced, and it is understood that the invention is not to be limited by the foregoing details, but rather is to be defined by the scope of the appended claims.

What is claimed is:

1. A computing device, comprising:
   an outer housing including a cover and a base, the outer housing being adapted to contain a plurality of internal device components therein;
   a processor located within the outer housing; and
   a fastening system including a plurality of fastenings that are collectively adapted to removably fasten the outer housing cover to the outer housing base, wherein each of the plurality of fastenings includes:
   a first opening associated with the outer housing cover,
   a threaded second opening associated with the outer housing base, and
   an oversized screw inserted through the first opening, and into the threaded second opening,
   wherein the oversized screw and threaded second opening combination is defined by contact between the oversized screw and the threaded second opening about a threaded surface of the threaded second opening that is substantially perpendicular to the primary axis, a screw thread return angle of 45 degrees or less, and a thread depth that is less than about triple the float between the major diameters of the oversized screw and the threaded second opening.

2. The computing device of claim 1, wherein center axes of the oversized screw and the threaded second opening are offset from each other such that a mating arrangement of the oversized screw and the second threaded opening is adequately secure.

3. The computing device of claim 2, wherein the float between the major diameters of the oversized screw accommodates the offset between the two center axes.

4. The computing device of claim 3, wherein the screw thread return angle is about 30 degrees.

5. The computing device of claim 4, wherein a thread arrangement of the threaded second opening follows a 30/0 pattern wherein a contact surface is at about a 0 degree angle with respect to a normal to an oversized screw axis and the return angle is about 30 degrees with respect to the normal.

6. The computing device as recited in claim 5, wherein the oversized screw has a major diameter of about 1.85 mm, a minor diameter of about 1.20 mm, a pitch of about 0.50 mm.

* * * * *

UNITED STATES PATENT AND TRADEMARK OFFICE
CERTIFICATE OF CORRECTION

| | | |
|---|---|---|
| PATENT NO. | : 8,573,911 B2 | Page 1 of 1 |
| APPLICATION NO. | : 13/610822 | |
| DATED | : November 5, 2013 | |
| INVENTOR(S) | : Brett W. Degner et al. | |

It is certified that error appears in the above-identified patent and that said Letters Patent is hereby corrected as shown below:

In the Claims:

Col. 11, line 1: Change "the float" to "an amount of float"

Col. 11, line 9: Change "the float" to "the amount of float"

Signed and Sealed this
First Day of April, 2014

Michelle K. Lee
*Deputy Director of the United States Patent and Trademark Office*